(12) United States Patent
Yoon et al.

(10) Patent No.: US 8,048,483 B2
(45) Date of Patent: Nov. 1, 2011

(54) METHOD FOR ROOM TEMPERATURE CHEMICAL VAPOR DEPOSITION ON FLEXIBLE POLYMER SUBSTRATES

(75) Inventors: Soon-Gil Yoon, Daejeon (KR); Nak-Jin Seong, Daejeon (KR); Sang-Yong Jeon, Chungcheongnam-do (KR)

(73) Assignee: The Industry & Academic Cooperation in Chungnam National University (IAC), Daejeon (KR)

( * ) Notice: Subject to any disclaimer, the term of this patent is extended or adjusted under 35 U.S.C. 154(b) by 365 days.

(21) Appl. No.: 11/783,048

(22) Filed: Apr. 5, 2007

(65) Prior Publication Data

US 2008/0193642 A1    Aug. 14, 2008

(30) Foreign Application Priority Data

Feb. 12, 2007   (KR) ................ 10-2007-0014346

(51) Int. Cl.
  *B05D 3/00*   (2006.01)
(52) U.S. Cl. ............ 427/189; 427/190; 427/248.1; 427/255.29
(58) Field of Classification Search .......... 427/248.1, 427/255.28, 255.29, 126.3, 189, 190
See application file for complete search history.

(56) References Cited

U.S. PATENT DOCUMENTS

| | | | | |
|---|---|---|---|---|
| 5,891,556 | A * | 4/1999 | Anderson et al. | 428/216 |
| 6,133,051 | A * | 10/2000 | Hintermaier et al. | 438/3 |
| 6,165,802 | A * | 12/2000 | Cuchiaro et al. | 438/3 |
| 6,176,930 | B1 * | 1/2001 | Koai et al. | 118/715 |
| 6,743,473 | B1 * | 6/2004 | Parkhe et al. | 427/252 |
| 6,858,158 | B2 * | 2/2005 | Chittibabu et al. | 252/183.11 |
| 2001/0020754 | A1 * | 9/2001 | Honda et al. | 264/81 |
| 2002/0098283 | A1 * | 7/2002 | Gurer et al. | 427/240 |
| 2006/0140031 | A1 * | 6/2006 | Kijima et al. | 365/202 |
| 2007/0004165 | A1 * | 1/2007 | Shin et al. | 438/393 |
| 2007/0218657 | A1 * | 9/2007 | Bet et al. | 438/479 |

FOREIGN PATENT DOCUMENTS

| | | | |
|---|---|---|---|
| GB | 2370271 A | * | 5/2001 |
| JP | 6-208806 | * | 7/1994 |
| JP | 11-236220 | * | 8/1999 |
| WO | WO 2006/096255 A2 | * | 9/2006 |

OTHER PUBLICATIONS

Jeon, Sang-Yong et al., "Nanocluster deposition for oxide thin film growth at near room temperature." Nanotechnology 19 (2008), pp. 1-6.*
Graf, M., et al., "Microfabricated gas sensor systems with sensitive nanocrystalline metal-oxide films". Journal of Nanoparticle Research (2006) 8 pp. 823-839.*
Ko, Seung H., et al., "All-inkjet-printed flexible electronics fabrication on a polymer substrate by low-tempeature high-resolution selective laser sintering of metal nanoparticles". Nanotechnology 18 (2007) 345202 pp. 1-8.*
Odijk, T., "Remarks on the depletion interaction between nanoparticles and flexible polymers". Physica A 278 (2000) pp. 347-355.*
Dement'eva, O.V., et al., "Metal Nanoparticles on Polymer Surfaces: 4. Preparation and Structure of Colloidal Gold Films". Colloid Journal, vol. 67, No. 2, 2005, pp. 123-133.*
Sang-Youn Jeon et al., "Electrical Properties of $Bi_3NbO_7$ (BNO) Fluorite Thin Films by Low Temperature Metalorganic Chemical Vapor Desposition" The $23^{rd}$ International Korea-Japan Seminar on Ceramics Nov. 22-24, 2006 Asan Korea pp. 139-142.

* cited by examiner

*Primary Examiner* — Bret Chen
(74) *Attorney, Agent, or Firm* — Edwards Angell Palmer & Dodge LLP; Kongsik Kim

(57) ABSTRACT

A method to deposit a thin film on a flexible polymer substrate at room temperature comprising heating source vapor, which is vaporized by an evaporator, in a shower head in a reaction chamber so that the source vapor is thermally decomposed to be converted into the nano-size single phase; and depositing the source vapor in the nano-size single phase on the flexible polymer substrate which is not separately heated.

1 Claim, 6 Drawing Sheets

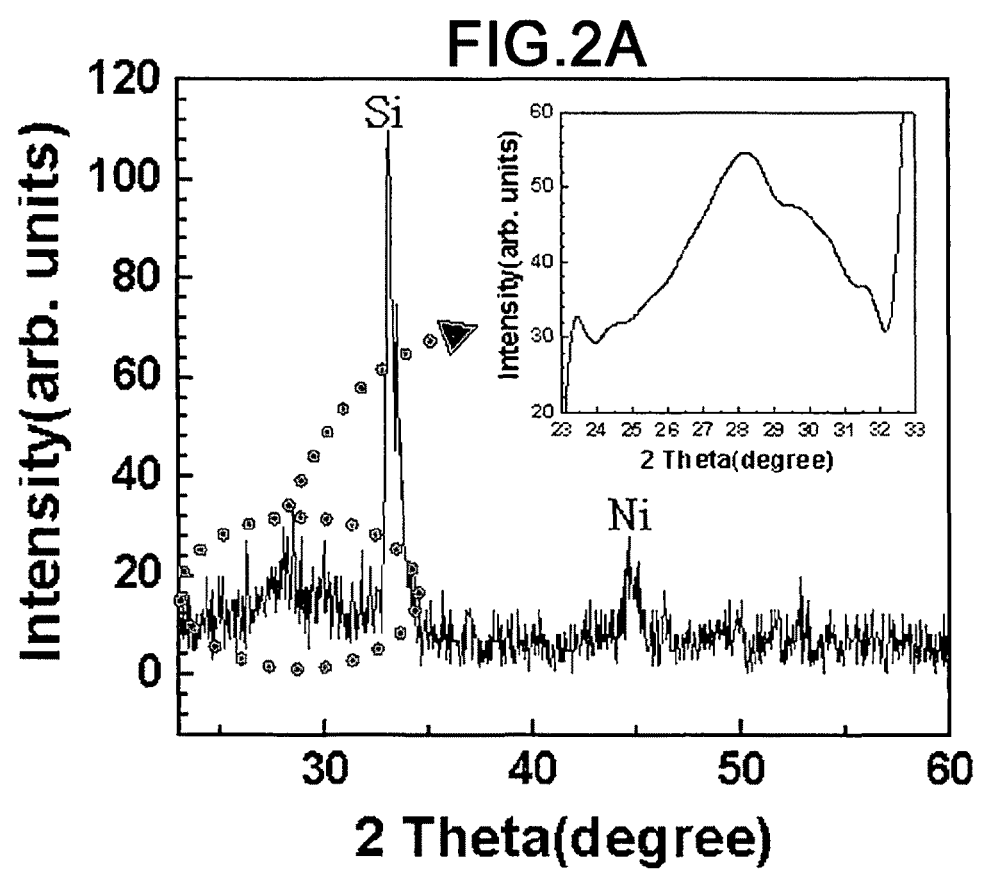

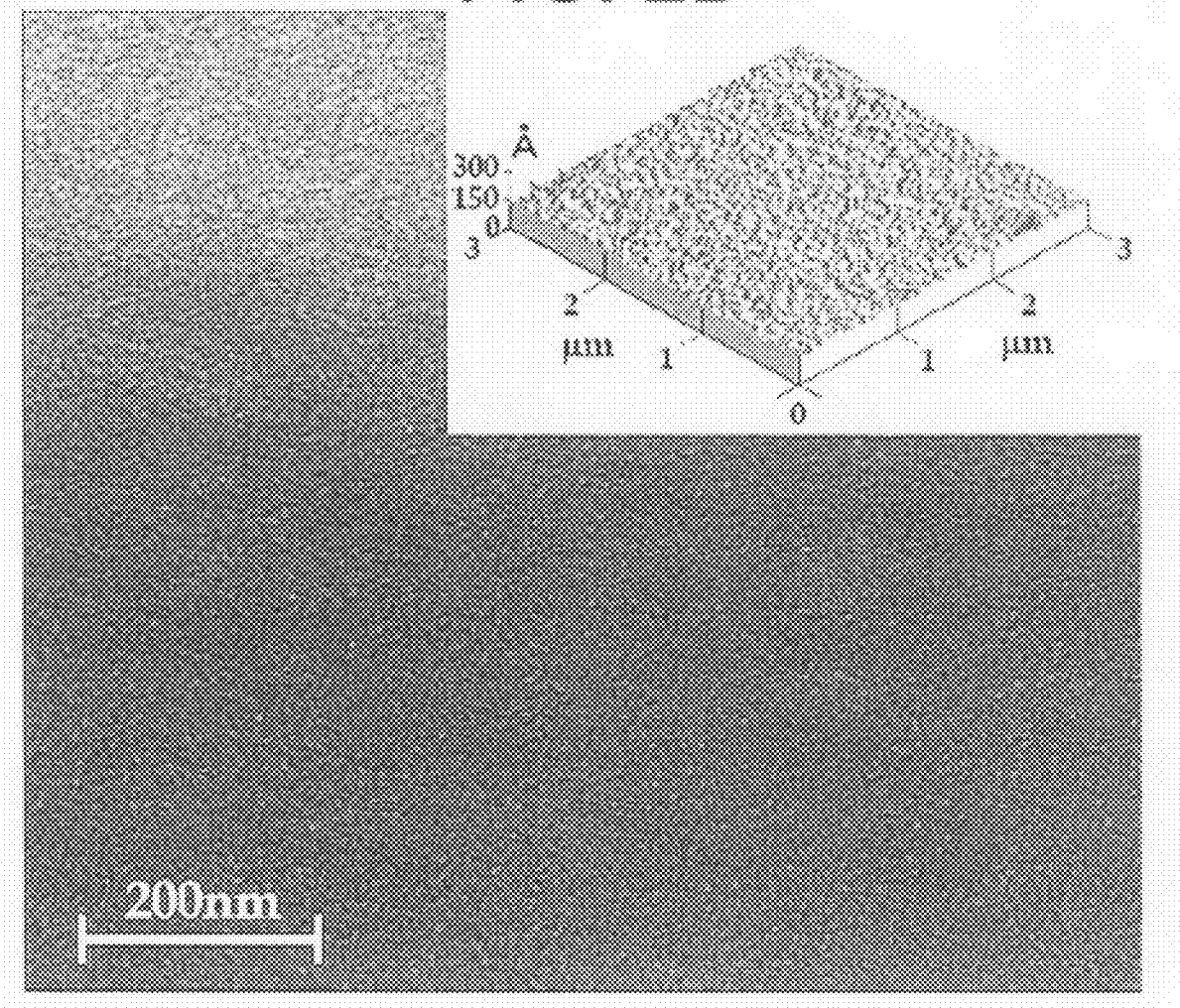

METHOD FOR ROOM TEMPERATURE CHEMICAL VAPOR DEPOSITION ON FLEXIBLE POLYMER SUBSTRATES

CROSS-REFERENCE TO RELATED APPLICATIONS

This application claims the benefit of Korean Patent Application No. 10-2007-0014346, filed Feb. 12, 2007, in the Korean Intellectual Property Office, the disclosure of which is incorporated herein by reference.

BACKGROUND OF THE INVENTION

1. Field of the Invention

The present invention relates to a method for room temperature chemical deposition on a flexible polymer and an apparatus therefor.

2. Description of the Related Art

As rapid operation and small-size trend of micro-systems, electronic equipments and apparatuses also seek high speed and small size. Also, due to the increase of the need of such equipments and apparatuses, the miniaturization are further required. The apparatuses should be manufactured in a smaller size while the whole functions remain or are improved. Therefore, concerns about cheap and reliable compact packages are increased.

In a general electric circuit, 80% of the electronic components are passive components (capacitor, resistance and inductance) and occupy 50% of the print-wiring-board area. Therefore, it has been attempted to embed the passive components on PCB (printed circuit boards) or compact the package using LTCC (low temperature co-fired ceramics).

By embedding of the passive components, in addition to the miniaturization, the signal path is very increased and consequently, noise is reduced, thereby improving performance of electronic products, particularly high frequency apparatus.

As an embedding capacitor processed at a temperature where the PCB can stand, $Bi_2O_3$—$ZnO$—$Nb_2O_5$(BZN) thin film has been reported by Park et al.

Organic thin film transistors (OTFT) are spot-lighted in application fields requiring structural flexibility, applicability at a large area, low temperature processibility and low expense. The OTFT mounted on low voltage operating/high output polymer substrate is expected to enable us to develop various techniques including low price digital logic apparatus, electronic book, electronic paper, wearable electronic products and large size flexible display.

Also, the electronic apparatuses are combined and miniaturized by using thin film technique suitable at a temperature near room temperature and miniaturized by providing a dielectric thin film having a high dielectric constant. The physical vapor deposition (PVD) technique such as sputtering and pulse laser deposition allows deposition without heating of the substrate though the film is not crystallized.

Generally, the hetero nucleation and growth in the film deposition by CVD are accomplished by adsorption, chemical reaction, desorption on the substrate surface at a high temperature. Therefore, the substrate should be heated to decompose precursors near the surface.

Meanwhile, in case of the flexible polymer substrate such as polyimide film which can realize small-size and light weight is readily applied to small size electronic equipments including mobile phone, PDA, notebook and the like and is well used in printer, HDD and the like because of practicability of three-dimensional wiring and excellent flexibility.

Also, unlike the conventional silicone based substrates, it can be advantageously produced continuously by the roll-to-roll fashion. However, in spite of such advantages, it has a difficulty in handling due to low mechanic strength and a limit in production process due to high contraction rate and weakness to heat (limit temperature resistance of about 200° C.). Particularly, the flexible polymer substrate had a difficulty in application to the conventional chemical vapor deposition, in which the substrate is heated over the critical temperature to decompose precursors. Also, the atomic layer deposition (ALD) which has recently developed for preparation of ultra thin film cannot be operated at a temperature under 200° C. which is temperature limit of the thin film on the flexible substrate.

In order to overcome the limits in treatment temperature, it is possible to reduce the temperature of the substrate for deposition of thin film by applying the plasma-enhanced CVD method. However, there may be defects such as poor conformal deposition or damage in the substrate by plasma.

Therefore, it is demanded to develop a novel room temperature CVD technique on a flexible polymer substrate which meets the small size and light weight trend of electronic parts and products and is readily performed.

SUMMARY OF THE INVENTION

Accordingly, the present invention has been made in view of the above-mentioned problems occurring in the prior art, and it is an aspect of the present invention is to provide a method and an apparatus for depositing a dielectric thin film on a flexible polymer substrate.

That is, it is an object of the present invention to provide a method and an apparatus for chemical deposition on a flexible polymer substrate, in which the substrate shows excellent structural and electrical properties without heating.

Also, it is another object of the present invention to provide a method for chemical deposition of a dielectric thin film on a flexible polymer substrate by using a conventional heating type chemical deposition apparatus.

To accomplish the above object, according to the present invention, upon deposition of a thin film using the CVD method, the heat for thermal decomposition of source gas and nucleation/growth is applied on the source gas in a shower head before the gas reaches a substrate, whereby it is possible to prevent thermal denaturation and deformation.

Generally, in the thin film deposition by CVD, hetero nucleation and growth is done by adsorption on the surface of the substrate, chemical reaction and desorption. Therefore, the substrate should be heated to a high temperature so that the precursors exist near its surface. Thus, the present invention is to thermally protect the flexible polymer substrate in the CVD method and apparatus.

To this end, the present invention provide a method for depositing a dielectric thin film on a flexible polymer substrate at room temperature, including:

(A) heating source vapor, which is vaporized by an evaporator, in a shower head in a reaction chamber so that the source vapor is thermally decomposed to be converted into the nano-size single phase; and (B) depositing the source vapor in the nano-size single phase on the flexible polymer substrate which is not separately heated.

Also, according to the present invention, in the operation (A), source vapor is a heated is a vapor mixture of bismuth and niobium and heated to 220° C. to 270° C., and in the operation (B), the temperature of the flexible polymer substrate is kept at 40 to 60° C.

According to another aspect of the present invention, there is provided an apparatus for room temperature chemical deposition on a flexible polymer substrate comprising an evaporator, a shower head (atomizer) and a reaction chamber, in which a heating source is further provided outside of the atomizer to thermally decompose the source vapor and a heating plate for heating the substrate is not provided in the reaction chamber.

Also, according to a further aspect of the present invention, there is provided a method for room temperature chemical deposition on a flexible polymer substrate using an apparatus for room temperature chemical deposition of a flexible polymer substrate comprising a n evaporator, a shower head and a reaction chamber provided with a heating plate for heating the substrate, in which the substrate is the flexible polymer substrate, the heating plate is not operated, and a heating source is further provided outside of the shower head to thermally decompose a source vapor.

According to the present invention, the conventional room temperature CVD method is improved as follows.

The precursors are continuously supplied to the evaporator by a liquid transport system and the produced vapor is transferred to the shower head in the reaction chamber. The shower head should be kept at a temperature of at least the decomposition temperature of the precursors and is designed to provide a sufficient time, for which the evaporated source vapor is completely decomposed (see the detailed structure of the shower head shown in FIG. 1). By the nano-size single phase formed in the shower head it is possible to deposit a thin film without heating of the substrate. In the present invention, the structural and electrical properties of the thin film deposited without heating of the substrate which is critical in determining the realization are examined.

In the following examples, the general idea of the room temperature CVD was demonstrated using $Bi_3NbO_7$ (BNO) as a dielectric substance. BNO has a cubic fluorite structure in nature and is known to have high dielectric constants (to 100) with low dissipation factor ($10 \times 10^{-4}$) upon application of a frequency of 1 MHz. The structural and electrical properties of the thin film deposited without heating of the substrate and the effect of the substrate temperature on the electrical properties of the BNO thin film were examined.

Now, the present invention is explained in detail with reference to the attached drawings and the following Examples. The drawings and Examples are presented only for illustrative purpose but the technical details and scope of the present invention are not limited thereto.

In the following Example, a conventional nickel-coated silicone substrate is used instead of the flexible polymer substrate. However, it is appreciated that the purpose of these Examples is to demonstrate that a source is effectively and sufficiently deposited at room temperature in the CVD process and the same method can be applied to a flexible polymer substrate.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 2A through 2D are a XRD pattern of the thin film prepared in Example 1 according to the present invention, an image of the SEM surface of the BNO film, a cross-sectional TEM image, and an enlarged view thereof, respectively.

DETAILED DESCRIPTION OF THE PREFERRED EMBODIMENTS

Figure 1B:
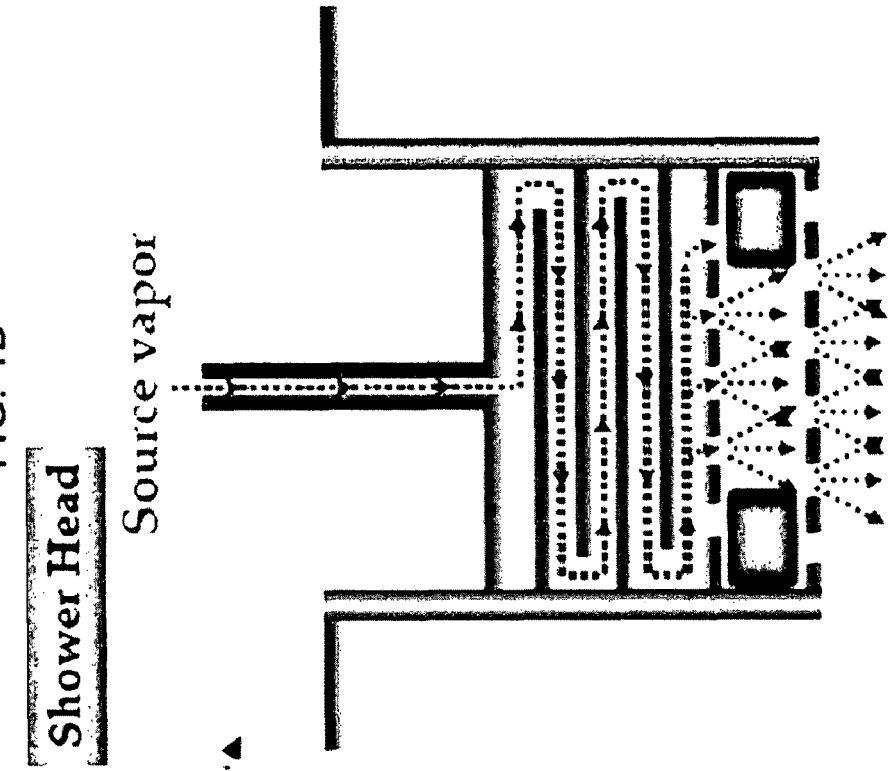
FIG. 1A and FIG. 1B are schematic views of the equipments for the liquid injection metal-organic chemical vapor deposition which can be used in performing the chemical deposition method according to embodiments of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

EXAMPLE 1

Figure 1A:
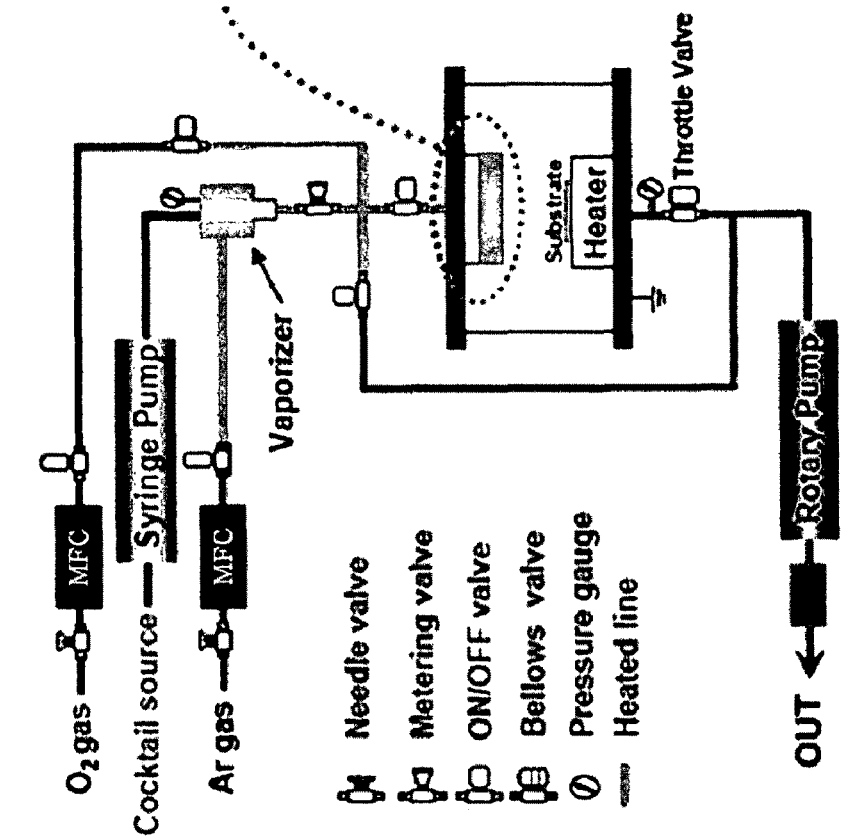

Preparation of Thin Film by Room Temperature Chemical Vapor Deposition $Bi(C_5H_{11}O_2)_3$ (Asahi Denka Co., Ltd) and $Nb[NC(CH_3)_2C_2H_5][N(CH_3)_2]_3$ (Kojundo Lab. Co., Ltd) precursors dissolved in hexane at a concentration of 0.05M were used as sources of bismuth and niobium. The decomposition temperature of the used precursors was about 220° C. The mixture source mixed in a desired molar ratio was continuously injected to a flash evaporator using a micro pump (for example; a syringe pump). The source was immediately evaporated when injected to the evaporator and transferred to the shower head in the MOCVD reaction chamber at a flow rate of 100 ml/min along with Ar gas. O2 as an oxidizing agent was constantly supplied to the shower head at a flow rate of 100 ml/min. The source vapors reacted with each other in the shower head kept at 250° C. The shower head had a size of about 5 inch and was provided with a heat supplying apparatus for heating itself. The temperature of the shower head was controlled by a temperature sensor attached at the inside. In order to examine the electrical properties, a nickel-coated silicone substrate was prepared by depositing nickel on a commercially available silicone substrate using a sputtering apparatus and kept at 50° C. without separate heating, because of the high temperature of the shower head (See FIG. 1A and FIG. 1B).

EXAMPLE 2

Analysis of Physical and Chemical Properties of Thin Film Prepared by Room Temperature Chemical Vapor Deposition (1) The crystal structure and orientation of the BNO film was measured by X-ray diffraction (XRD, REGAKU D/MAX-RC) using CuKα radiation and a nickel filter.

Figure 2D:
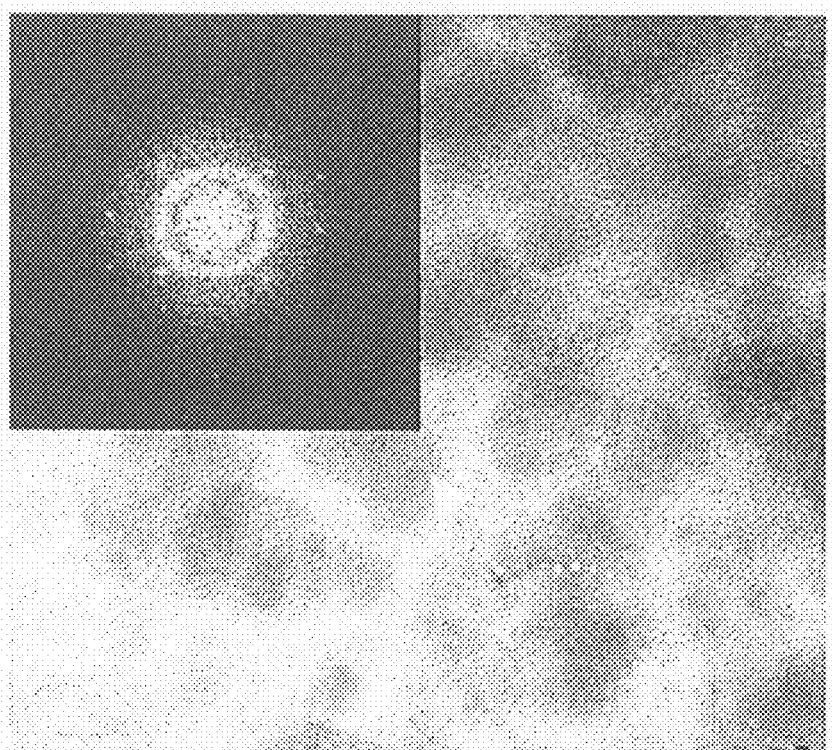
Figure 2C:
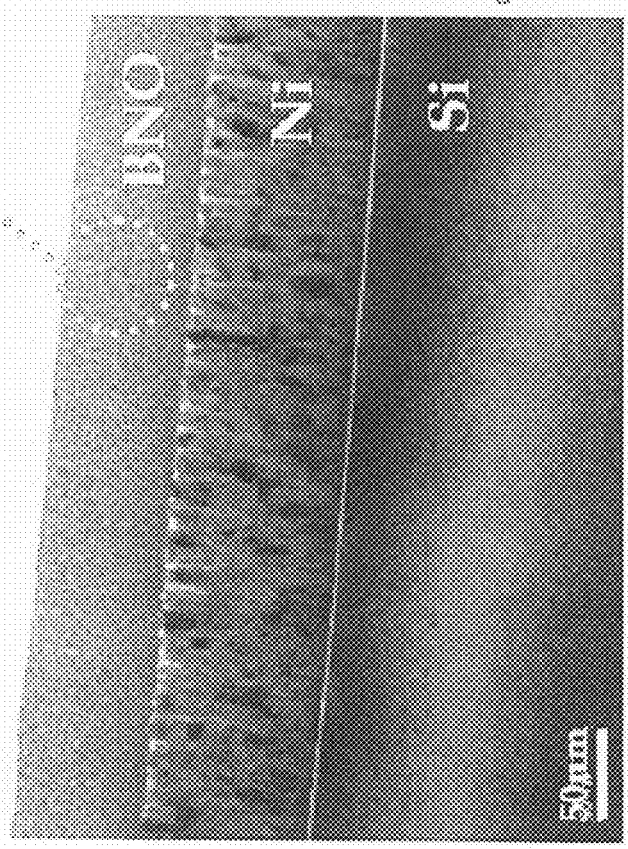

The surface roughness of the BNO film was measured by atomic force microscopy (AFM) and the crystal structure of the BNO film was measured by TEM (See FIG. 2). The formation of the BNO single phase was clearly identified using EDS mounted on TEM and X-ray photoelectron spectroscopy (XPS) (See FIGS. 2A through 2D and FIGS. 3A through 3D). The composition of the thin film deposited with various mixture source at different Bi/Nb molar ratio was analyzed by RBS (Rutherford backscattering spectroscopy) (See FIGS. 3A through 3D). The dielectric property of the Pt/BNO/Ni/Si structure was evaluated by impedance analysis (HP 4194A) in the range of 100 Hz to 100 MHz (See FIG. 4A and FIG. 4B). The leakage current property of the thin film was examined using a semiconductor parameter analyzer (HP 4145B).

The electrical property was measured by a Pt-top electrode having a dimension of 100×100 μm2 which had been accurately patterned the film by lift-off lithography and sputtered by a Dc magnetron sputter.

(1) Analysis of Surface Roughness and Cross-Section of Thin Film

FIG. 2A is the XRD pattern obtained by analyzing the BNO thin film with a thickness of 70 nm deposited at room temperature without heating of the substrate (actual temperature of the substrate was about 50° C.) at a electric power of 30 kV/60 mA and a scan rate of 3° per minute. If the BNO thin film was crystallized, the center peak indicating the BNO (222) surface would be observed at $2\theta=29°$ in the scan range. However, it was difficult to determine the crystallinity of the BNO thin film from the peak intensity of the XRD pattern at $2\theta=29°$.

In order to clearly verify the peak at $2\theta=29°$, the peak intensity was observed in the range of $2\theta=24°$ to 33° at a high electric power of 40 kV/100 mA and a slow frequency scan rate of 1° per minute. The result of the scan of the thin film deposited at room temperature is shown in FIG. 2A. A blunt peak was observed at $2\theta=29°$. However, this observation, it was impossible to confirm if the room temperature deposited thin film had the typical nano-size crystal or pure amorphous structure.

FIG. 2B is an image of the SEM surface of the BNO thin film deposited without heating of the substrate. The thin film showed smooth and dense surface condition with a roughness of about 0.9 nm root mean square (rms). In the adhesion test using an adhesive tape, the thin film showed strong adhesion between the deposited layer and the Ni bottom electrode (data not shown). The crystallinity of the thin film can be confirmed from the cross-sectional TEM image of FIGS. 2C and 2D. As shown in FIG. 2C, the BNO thin film deposited on the nickel coated silicone substrate had a thickness of the BNO layer of 70 nm and is provided with a distinct interface between the BNO layer and the Ni bottom electrode. FIG. 2D is an enlarged image of the BNO layer of FIG. 2(C). The thin film deposited without heating of the substrate showed partial nano-size crystalline phase of about average 6 nm in the BNO layer and the selected-area diffraction patterns (SADP) in the crystallized area of the BNO thin film showed a clear ring shape meaning polycrystallinity (See FIG. 2D). In the inner graph of FIG. 2A, the polycrystal size of the BNO thin film calculated from the full-width-half-maximum (FWHM) value of the peak at $2\theta=29°$ by Scherrer equation was about 6.5 nm which agreed the TEM result (see FIG. 2D).

(2) Confirmation of Formation of Single Phase in Thin Film

It is important to confirm that the thin film deposited at 50° C. comprises a mixture phase of $Bi_2O_3$ and $Nb_2O_5$ or a BNO single phase. If the thin film was a mixture phase, it should be annealed at a high temperature to obtain the BNO single phase. However, such high temperature treatment was not suitable for the thin film deposited on the flexible polymer substrate.

Figure 3B:
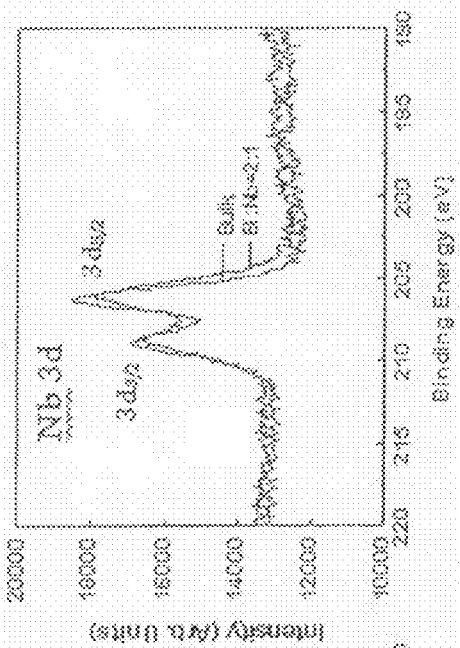
FIGS. 3A through 3D show XPS spectra of Bi 4f, Nb 3d, O 1s, and a core cell and a component analysis graph by energy dispersion spectrum of the TEM image in the thin film prepared in Examples, respectively.
Figure 3A:
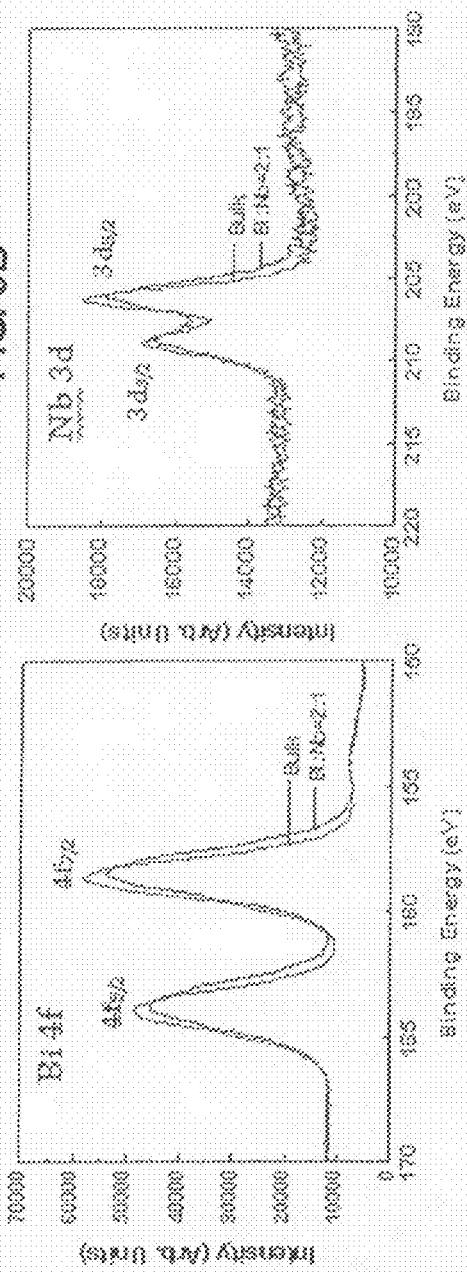
Figure 3D:
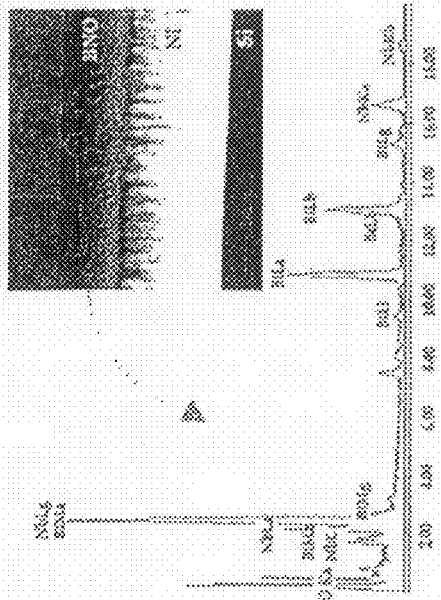
Figure 3C:
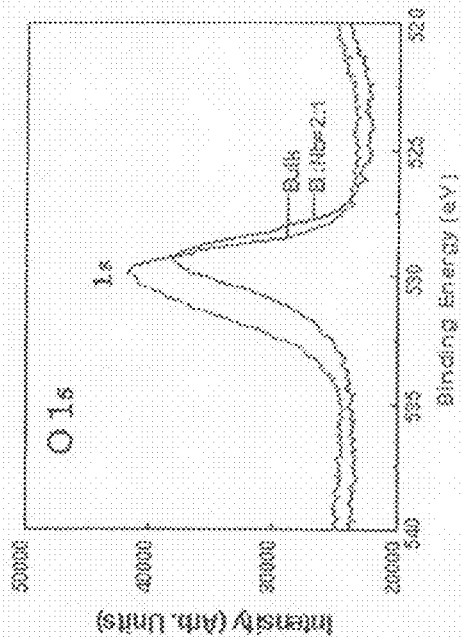

FIGS. 3A, 3B and 3C show XPS spectra of Bi 4f, Nb 3d and O 1s core cell in the BNO thin film deposited at 50° C. by CVD using the BNO bulk material. The film deposited at 50° C. using a mixture source of Bi:Nb=2:1(molar ratio) had stoichiometric composition of BNO. The binding energy of respective elements of the thin film deposited by CVD showed somewhat higher than the BNO bulk material. However, the shapes of the core cells of the thin film agreed with those of the core cells of the BNO bulk material.

From this, it was noted that the thin film deposited at 50° C. according to the present invention was formed of the BNO single phase.

Another evidence that the deposited thin film was the BNO single phase was obtained through component analysis by energy dispersive spectroscopy (EDS) of the TEM image. The component of the crystalline phase of the BNO layer (indicated by a small circle) was analyzed and the result is shown in FIG. 3D. The light beam for component analysis had a diameter of about 1 nm, smaller than the size of the crystalline phase.

The EDS results measured at various parts of the thin film clearly showed that the thin film according to the present invention contained Bi, Nb and O in their elemental state, and thereby, was the BNO single phase.

Figure 4A:
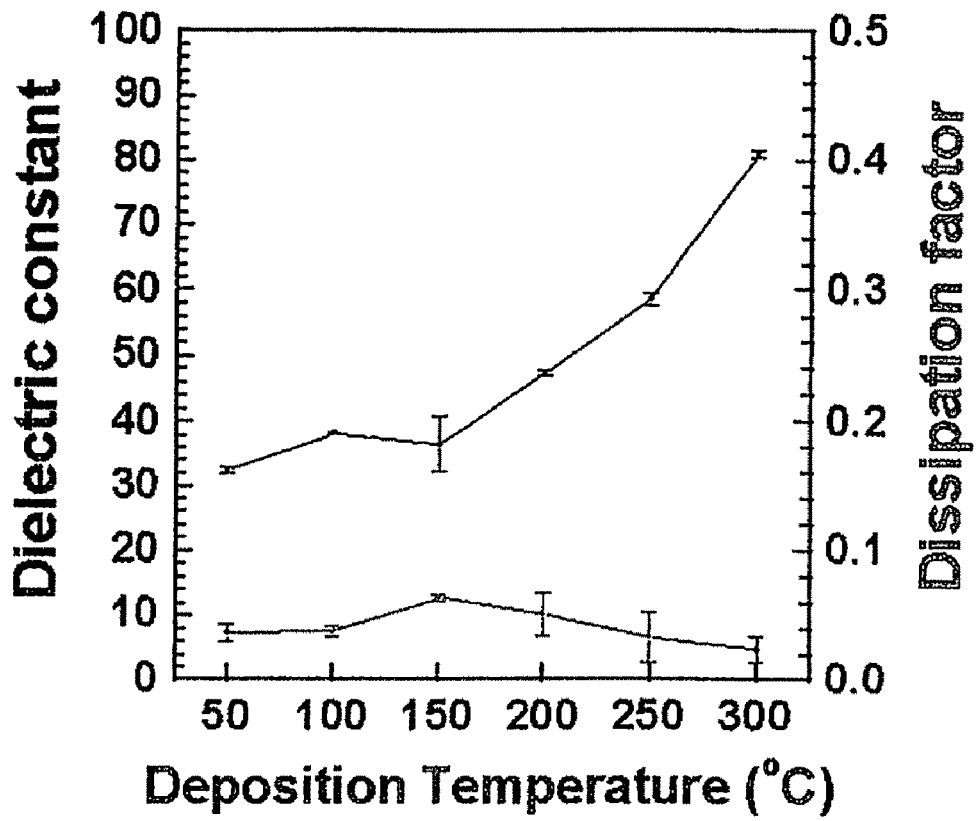
FIG. 4A shows the change of the dielectric constant and the dissipation factor of the thin film according to the deposition temperature and FIG. 4B shows the change of the leakage current density according to the applied electric field in the thin film prepared in Examples.

(3) Relation between Deposition Temperature and Electrical Property of Thin Film FIG. 4A showed the change in dielectric constant and dissipation factor of the BNO thin film according to the deposition temperature. Here, the nickel coated substrate was kept at about 50° C. with separate heating and in the experiment at a temperature higher than that, the substrate was heated using a separate heating apparatus mounted under the substrate. The substrate holder shown in FIG. 1 was designed to heat the substrate by resistive heating and increase temperature upon deposition.

By varying the deposition temperature to 300° C., the thin film had various thicknesses in the range of 50 to 60 nm (data not shown). When the deposition temperature increased, the dielectric constant of the thin film slightly increased. The thin film deposited at 50° C. had a dielectric constant of about 32. The thin film deposited at 200° C. which was the maximum temperature at which the flexible polymer substrate could be used showed a dielectric constant and dissipation factor of about 48 and 4%, respectively. These values were similar to the BNO film with a thickness of 200 nm deposited by pulse laser deposition at 298K. It has been already known that the bismuth based fluorite thin film and pyrochlore thin film deposited at room temperature by pulse laser deposition show high dielectric constants.

Figure 4B:
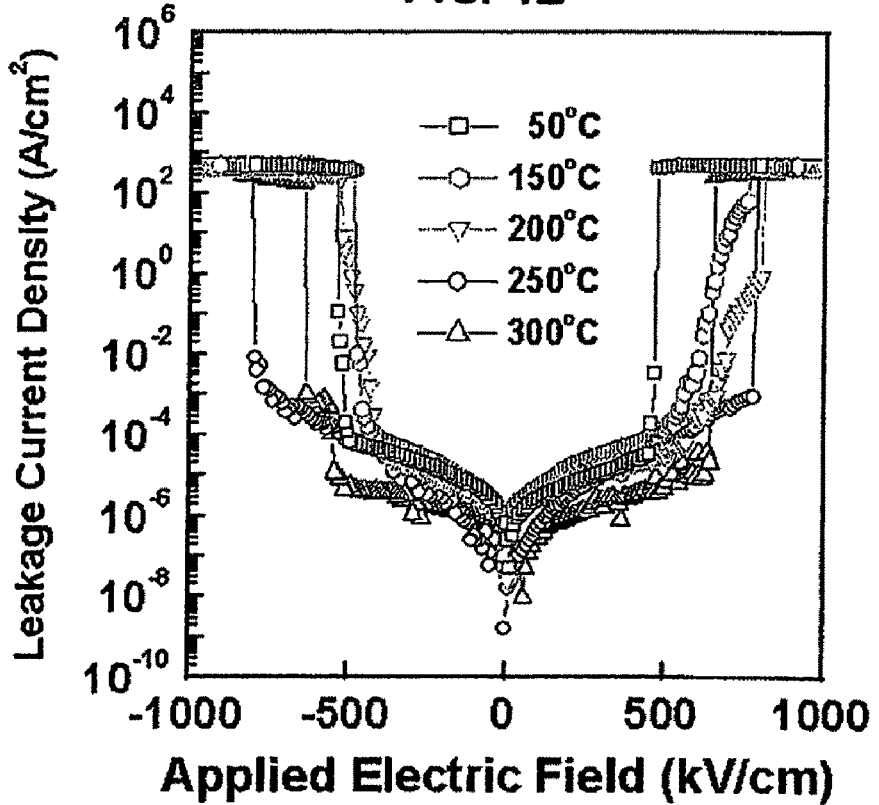

In FIG. 4B, was shown the change in leakage current density according to the change in electric field applied to thin films deposited at various temperatures. The thin film with a thickness of 60 nm deposited at 50° C. also showed typical leakage current property of dielectric BNO substance having a breakdown strength of about 500 kV/cm and the leakage current property of the thin film deposited at the high temperature of 300° C. was similar to that of the thin film deposited at 50° C. according to the present invention.

The leakage current property of the BNO thin film with a thickness of 60 nm deposited at 50° C. according to the present invention showed more stable property than the $Bi_2Mg_{2/3}Nb_{4/3}O_7$ pyrochlore thin film deposited on the Cu/Si substrate at 100° C. by pulse laser deposition.

According to the present invention, various flexible substrates including polymers can be used in deposition of a thin film and characteristic CVD advantages such as the large area deposition and conformal deposition, as compared to PVD, can be utilized.

Also, the novel CVD method according to the present invention would be a useful tool in deposition of a dielectric film for application of flexible electronic elements.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method of chemically depositing a thin film on a flexible polymer substrate, the method comprising:

evaporating a precursor by an evaporator to provide a source vapor;

transferring the source vapor to a shower head disposed in a reaction chamber;

heating the shower head by a heating source provided with the shower head disposed in the reaction chamber to a temperature identical to or higher than the decomposition temperature of the precursor;

holding the transferred source vapor in the shower head for a predetermined time sufficient to thermally decompose the source vapor into nano-size single phase nanoparticles; and depositing the nano-size single phase nanoparticles on the flexible polymer substrate, wherein the precursor of the source vapor is a mixture of bismuth and niobium, the shower head is heated to a temperature of 220° C. to 270° C., and the flexible polymer substrate is at 40° C. to 60° C.

* * * * *